(12) United States Patent
Yebka et al.

(10) Patent No.: US 11,599,166 B2
(45) Date of Patent: Mar. 7, 2023

(54) SHAPE-MEMORY HEAT ABSORBERS

(71) Applicant: Lenovo (Singapore) Pte. Ltd., Singapore (SG)

(72) Inventors: Bouziane Yebka, Apex, NC (US); Joseph Anthony Holung, Wake Forest, NC (US); Tin-Lup Wong, Chapel Hill, NC (US); Philip John Jakes, Durham, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 195 days.

(21) Appl. No.: 16/930,317

(22) Filed: Jul. 16, 2020

(65) Prior Publication Data
US 2022/0018606 A1 Jan. 20, 2022

(51) Int. Cl.
*G06F 1/20* (2006.01)
*H01L 23/36* (2006.01)
(Continued)

(52) U.S. Cl.
CPC ............. *G06F 1/203* (2013.01); *H01L 23/36* (2013.01); *H01L 23/373* (2013.01); *H01L 23/4275* (2013.01)

(58) Field of Classification Search
CPC ...... F28D 15/0233; F28D 20/02; F28D 21/00; F28D 2021/0028; F28F 13/00;
(Continued)

(56) References Cited

U.S. PATENT DOCUMENTS

| 4,513,053 | A | * | 4/1985 | Chen | F28D 20/023 |
|---|---|---|---|---|---|
| | | | | | 428/221 |
| 5,709,945 | A | * | 1/1998 | Lee | C09K 5/06 |
| | | | | | 428/407 |

(Continued)

FOREIGN PATENT DOCUMENTS

| CN | 106634857 A | * | 5/2017 | ............... C09K 5/06 |
|---|---|---|---|---|
| CN | 111253913 B | * | 6/2020 | ............. C09K 5/063 |

(Continued)

OTHER PUBLICATIONS

English Translation of KR20180057440A (Year: 2018).*

(Continued)

*Primary Examiner* — Zachary Pape
*Assistant Examiner* — Amir A Jalali
(74) *Attorney, Agent, or Firm* — John M. Rogitz; John L. Rogitz

(57) ABSTRACT

In one aspect, a device may include a housing, at least one processor within the housing, storage accessible to the at least one processor and within the housing, and plural heat absorbers within the housing that may be spherical. Each heat absorber may include an outer shell and inner material. The outer shell may include a shape-memory material. The inner material may include phase-change material different from the shape-memory material. The melting point of the phase-change material may be lower than the melting point of the shape-memory material. The heat absorbers may be juxtaposed with one or more other components of the device to absorb heat from the one or more other components.

20 Claims, 10 Drawing Sheets

(51) Int. Cl.
*H01L 23/427* (2006.01)
*H01L 23/373* (2006.01)

(58) Field of Classification Search
CPC ........ F28F 21/00; F28F 27/02; F28F 2255/04; Y02E 60/14; H01L 23/36; H01L 23/427; H01L 23/373; H01L 23/3737; H01L 35/30; H01L 35/32; G06F 1/203; G06F 1/1635; C09K 5/02; C09K 5/06–066; H05K 7/20154; H05K 7/20336; H05K 7/20854; H05K 7/2039; H05K 7/2029; B32B 2311/005; B32B 27/14; B32B 2392/00
See application file for complete search history.

(56) References Cited

U.S. PATENT DOCUMENTS

| | | | | |
|---|---|---|---|---|
| 8,587,945 | B1 * | 11/2013 | Hartmann | H01L 23/42 361/720 |
| 9,314,768 | B2 * | 4/2016 | Gueret | B01D 53/02 |
| 2004/0159422 | A1 * | 8/2004 | Zuo | F28D 20/023 257/E23.088 |
| 2011/0036537 | A1 * | 2/2011 | Seki | C09K 5/063 165/10 |
| 2014/0023853 | A1 * | 1/2014 | Gueret | B01J 20/2803 428/323 |
| 2014/0147656 | A1 * | 5/2014 | Browne | B32B 27/08 428/313.9 |
| 2015/0232973 | A1 * | 8/2015 | Browne | C22F 1/006 148/563 |
| 2017/0044415 | A1 * | 2/2017 | Akiyama | B01J 21/04 |
| 2018/0009996 | A1 * | 1/2018 | Lentz | A01N 59/20 |
| 2018/0242665 | A1 * | 8/2018 | Ryan | B01J 20/3246 |
| 2020/0054886 | A1 * | 2/2020 | Hof | A61K 9/5192 |
| 2020/0373221 | A1 * | 11/2020 | Cinar | H01L 23/24 |
| 2021/0083342 | A1 * | 3/2021 | Ryu | H01M 10/659 |

FOREIGN PATENT DOCUMENTS

| | | | | |
|---|---|---|---|---|
| DE | 102009029793 | A1 * | 12/2010 | ............ C09K 5/063 |
| JP | 2010132845 | A | * 6/2010 | |
| JP | 2016053439 | A | * 4/2016 | ............ Y02E 60/14 |
| KR | 20130128163 | A | * 11/2013 | ............ C09K 5/06 |
| KR | 20180057440 | A | * 5/2018 | ............ B01J 13/14 |
| WO | WO-2015105204 | A1 * | 7/2015 | ............ C09K 5/063 |
| WO | WO-2017135025 | A1 * | 8/2017 | ............ C09K 5/06 |
| WO | WO-2020041320 | A1 * | 2/2020 | ............ B33Y 10/00 |

OTHER PUBLICATIONS

English Translation of JP2016053439A (Year: 2016).*
English Translation of WO2017135025A1 (Year: 2017).*
English Translation of KR20130128163A (Year: 2013).*
English Translation of WO2020041320A1 (Year: 2020).*
English Translation on CN111253913 (Year: 2020).*
"Matsumoto Microsphere$^{SM}$F and FN series", Matsumoto Yushi-Seiyaku Co., Ltd. Retrieved from https://www.mtmtys.co.jp/e/product/general/data01.html.
"PCM Products", PCM. Retrieved from https://www.pcmproducts.net/.
"PCM Products", PCM. Retrieved from https://www.pcmproducts.net/Phase_Change_Material_Products.htm.
"PlusICE Range-A", PCM. Retrieved from http://www.pcmproducts.net/files/A range-2018.pdf.
"PlusICE Range-E", ACM. Retrieved from http://www.pcmproducts.net/files/E range-2018.pdf.
"PlusICE Range-H", PCM. Retrieved from http://www.pcmproducts.net/files/H range-2018.pdf.
"PlusICE Range-S", PCM. Retrieved from http://www.pcmproducts.net/files/S range-2018.pdf.
"PlusICE Range-X", PCM. Retrieved from http://www.pcmproducts.net/files/X range-2018.pdf.
"Shape-memory polymer", Wikipedia. Retrieved from https://en.wikipedia.org/wiki/Shape-memory_polymer.
"Spherical Particles", Cospheric—Precision Spherical Particles Globally. Retrieved from https://www.cospheric.com/spheres_microparticles_beads.htm.
"Types of Phase Change Materials", PCM. Retrieved from https://www.pcmproducts.net/Phase-Change-Material-Solutions.htm.
Kenisarin, Murat, "Fig. 2", ResearchGate. Retrieved from https://www.researchgate.net/figure/Commercially-manufactured-phase-change-heat-storage-products_fig1_223854373.
Mhadhbi, M. ,"Phase Change Materials and Their Applications—Abstract". IntechOpen. (Ed.). (2018). https://doi.org/10.5772/intechopen.71894.
Papageorgiou, Marianna, "4D Printing a Shape Polymer", Sculpteo, Jan. 9, 2018. Retrieved from https://www.sculpteo.com/blog/2018/01/09/4d-printing-a-shape-memory-polymer/.
Rathod, Manish. "Thermal Stability of Phase Change Material—Abstract". Phase Change Materials and Their Applications, edited by Mohsen Mhadhbi, IntechOpen, 2018. 10.5772/intechopen.75923.
Sathya, Sharathmira, "Phase Changing Material Introduction with Medical application", SlideShare, May 29, 2017. Retrieved from https://www.slideshare.net/sarathkumar388/phase-changing-material-introduction-with-medical-application.
Trojanowska, Anna, Nogalska, Adrianna, Valls, Ricard Garcia, Giamberini, Marta and Tylkowski, Bartosz. "Technological solutions for encapsulation". Physical Sciences Reviews, vol. 2, No. 9, 2017. https://www.degruyter.com/view/journals/psr/2/9/article-20170020.xml?tab_body=fullHtml-75008.
Wu et al., "Mechanisms of the Shape Memory Effect in Polymeric Materials", Sep. 30, 2013, Polymers 2013, 5, 1169-1202. Retrieved from https://www.mdpi.com/2073-4360/5/4/1169/htm.
Zhang Ruguo, Zheng Hua, Zhang Hong, Feng Ying, Li Kun, Zhang Wenwen, "Thermal Analysis of Four Insect Waxes Based on Differential Scanning Calorimetry (DSC)",Procedia Engineering, vol. 18, 2011, pp. 101-106.

* cited by examiner

SHAPE-MEMORY HEAT ABSORBERS

FIELD

The present application relates to technically inventive, non-routine solutions that produce concrete technical improvements in the fields of heat transfer and heat absorption.

BACKGROUND

As recognized herein, components of electronic devices such as laptop computers and smart phones can generate heat that can not only make the devices hot to the touch but that can also interfere with performance and operation of the devices themselves. Excessive heat can also permanently degrade parts and components within a device, making them unusable and potentially making the device itself unusable. Existing heat dissipation solutions are inadequate, particularly for thin and fan-less devices that have limited space. Thus, there are currently no adequate solutions to the foregoing computer-related, technological problem.

SUMMARY

Accordingly, in one aspect a device includes a housing, at least one processor within the housing, and storage accessible to the at least one processor and within the housing. The device also includes plural spherical heat absorbers within the housing, where each spherical heat absorber includes an outer shell and inner material. The outer shell includes a first shape-memory material and the inner material includes a first phase-change material different from the first shape-memory material.

In some implementations, the first shape-memory material may include or consist of a carbon crosslinked polymer such as polycaprolactone.

Also in some example implementations, the first shape-memory material may include a second phase-change material different from the first phase-change material. The second phase-change material may have a higher melting point than the first phase-change material, where in some examples the first phase-change material itself may include paraffin wax. Furthermore, in some examples the inner material may include a third phase-change material different from the first and second phase-change materials, where the third phase-change material may have a melting point higher than the first phase-change material and the second phase-change material. In some of these examples, the third phase-change material may even establish a second shape-memory material different from the first shape-memory material. So, for example, the third phase-change material may establish a shape-memory foam or sponge, with the shape-memory foam or sponge storing at least some of the first phase-change material within.

Still further, in some implementations at least some of the spherical heat absorbers are arranged within the device to absorb heat from the processor. Additionally or alternatively, the device may include at least one battery and/or at least one wireless transceiver within the housing, and at least some of the spherical heat absorbers may be arranged within the device to absorb heat from the battery and/or wireless transceiver.

In another aspect, a method includes providing a device that includes a housing, and providing plural heat absorbers within the housing. The heat absorbers are juxtaposed with one or more other components of the device to absorb heat from the one or more other components. Each heat absorber includes an outer shell and inner material. The outer shell includes a shape-memory material and the inner material includes phase-change material different from the shape-memory material. So, for example, the shape-memory material may include a shape-memory polymer.

Additionally, in some implementations the method may include configuring the shape-memory polymer for shape-memory using four-dimensional (4D) printing.

In still another aspect, a heat absorber element includes an outer shell and inner material. The outer shell includes a first shape-memory material. The inner material is housed within the outer shell and includes first phase-change material different from the first shape-memory material. The melting point of the first phase-change material is lower than the melting point of the first shape-memory material.

In some examples, the outer shell may have a spheroid remembered shape.

Also in some examples, the inner material may include a second phase-change material different from the first phase-change material and different from the first shape-memory material. The second phase-change material may have a melting point higher than the first phase-change material and the first shape-memory material. The second phase-change material may also establish a second shape-memory material.

The details of present principles, both as to their structure and operation, can best be understood in reference to the accompanying drawings, in which like reference numerals refer to like parts, and in which:

DETAILED DESCRIPTION

Figure 1:
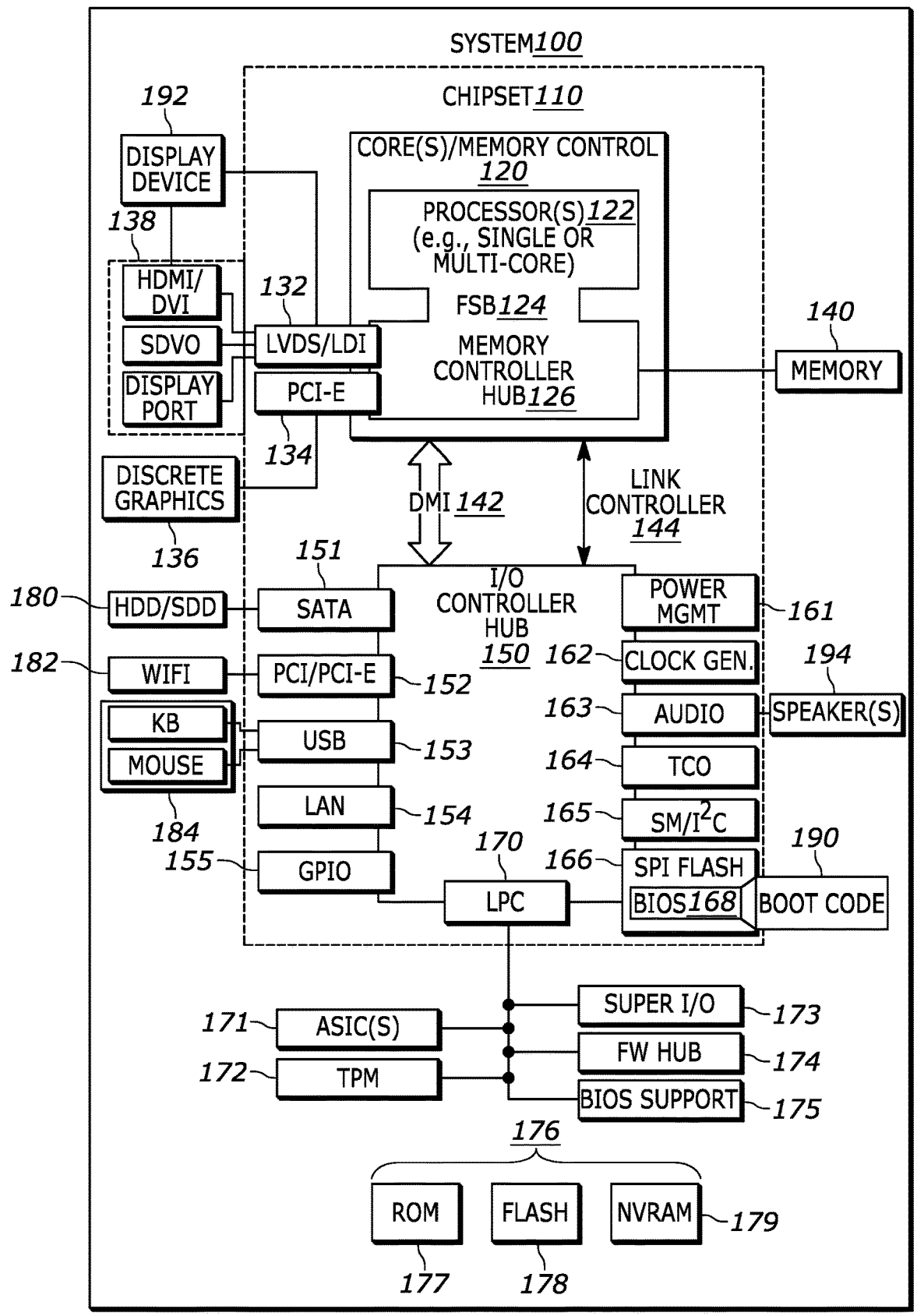
FIG. 1 is a block diagram of an example system consistent with present principles.

The present disclosure is directed to, among other things, compact cooling elements to remove/absorb heat from a computer system, from other electronic devices, from mechanical systems, from stainless steel, polypropylene, and polyolefin components, etc. The elements may encapsulate one or more phase change materials inside the elements using a shape-memory polymer shell or other shape-memory material for the shell, which itself may change phases as heat is absorbed by the element, in order to obtain intimate contact between surfaces without any external power being applied.

Prior to delving further into the details of the instant techniques, note with respect to any computer systems discussed herein that a system may include server and client components, connected over a network such that data may be exchanged between the client and server components. The client components may include one or more computing devices including televisions (e.g., smart TVs, Internet-enabled TVs), computers such as desktops, laptops and tablet computers, so-called convertible devices (e.g., having a tablet configuration and laptop configuration), and other mobile devices including smart phones. These client devices may employ, as non-limiting examples, operating systems from Apple Inc. of Cupertino Calif., Google Inc. of Mountain View, Calif., or Microsoft Corp. of Redmond, Wash. A Unix® or similar such as Linux® operating system may be used. These operating systems can execute one or more browsers such as a browser made by Microsoft or Google or Mozilla or another browser program that can access web pages and applications hosted by Internet servers over a network such as the Internet, a local intranet, or a virtual private network.

As used herein, instructions refer to computer-implemented steps for processing information in the system. Instructions can be implemented in software, firmware or hardware, or combinations thereof and include any type of programmed step undertaken by components of the system; hence, illustrative components, blocks, modules, circuits, and steps are sometimes set forth in terms of their functionality.

A processor may be any general purpose single- or multi-chip processor that can execute logic by means of various lines such as address lines, data lines, and control lines and registers and shift registers. Moreover, any logical blocks, modules, and circuits described herein can be implemented or performed with a general purpose processor, a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can also be implemented by a controller or state machine or a combination of computing devices. Thus, the methods herein may be implemented as software instructions executed by a processor, suitably configured application specific integrated circuits (ASIC) or field programmable gate array (FPGA) modules, or any other convenient manner as would be appreciated by those skilled in those art. Where employed, the software instructions may also be embodied in a non-transitory device that is being vended and/or provided that is not a transitory, propagating signal and/or a signal per se (such as a hard disk drive, CD ROM or Flash drive). The software code instructions may also be downloaded over the Internet. Accordingly, it is to be understood that although a software application for undertaking present principles may be vended with a device such as the system 100 described below, such an application may also be downloaded from a server to a device over a network such as the Internet.

Software modules and/or applications described by way of flow charts and/or user interfaces herein can include various sub-routines, procedures, etc. Without limiting the disclosure, logic stated to be executed by a particular module can be redistributed to other software modules and/or combined together in a single module and/or made available in a shareable library.

Logic when implemented in software, can be written in an appropriate language such as but not limited to hypertext markup language (HTML)-5, Java/JavaScript, C# or C++, and can be stored on or transmitted from a computer-readable storage medium such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc.

In an example, a processor can access information over its input lines from data storage, such as the computer readable storage medium, and/or the processor can access information wirelessly from an Internet server by activating a wireless transceiver to send and receive data. Data typically is converted from analog signals to digital by circuitry between the antenna and the registers of the processor when being received and from digital to analog when being transmitted. The processor then processes the data through its shift registers to output calculated data on output lines, for presentation of the calculated data on the device.

Components included in one embodiment can be used in other embodiments in any appropriate combination. For example, any of the various components described herein and/or depicted in the Figures may be combined, interchanged or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

The term "circuit" or "circuitry" may be used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Now specifically in reference to FIG. 1, an example block diagram of an information handling system and/or computer system 100 is shown that is understood to have a housing for the components described below. Note that in some embodiments the system 100 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a client device, a server or other machine in accordance with present principles may include other features or only some of the features of the system 100. Also, the system 100 may be, e.g., a game console such as XBOX®, and/or the system 100 may include a mobile communication device such as a mobile telephone, notebook computer, and/or other portable computerized device.

As shown in FIG. 1, the system 100 may include a so-called chipset 110. A chipset refers to a group of integrated circuits, or chips, that are designed to work together.

Chipsets are usually marketed as a single product (e.g., consider chipsets marketed under the brands INTEL®, AMD®, etc.).

In the example of FIG. 1, the chipset 110 has a particular architecture, which may vary to some extent depending on brand or manufacturer. The architecture of the chipset 110 includes a core and memory control group 120 and an I/O controller hub 150 that exchange information (e.g., data, signals, commands, etc.) via, for example, a direct management interface or direct media interface (DMI) 142 or a link controller 144. In the example of FIG. 1, the DMI 142 is a chip-to-chip interface (sometimes referred to as being a link between a "northbridge" and a "southbridge").

The core and memory control group 120 include one or more processors 122 (e.g., single core or multi-core, etc.) and a memory controller hub 126 that exchange information via a front side bus (FSB) 124. As described herein, various components of the core and memory control group 120 may be integrated onto a single processor die, for example, to make a chip that supplants the "northbridge" style architecture.

The memory controller hub 126 interfaces with memory 140. For example, the memory controller hub 126 may provide support for DDR SDRAM memory (e.g., DDR, DDR2, DDR3, etc.). In general, the memory 140 is a type of random-access memory (RAM). It is often referred to as "system memory."

The memory controller hub 126 can further include a low-voltage differential signaling interface (LVDS) 132. The LVDS 132 may be a so-called LVDS Display Interface (LDI) for support of a display device 192 (e.g., a CRT, a flat panel, a projector, a touch-enabled light emitting diode display or other video display, etc.). A block 138 includes some examples of technologies that may be supported via the LVDS interface 132 (e.g., serial digital video, HDMI/DVI, display port). The memory controller hub 126 also includes one or more PCI-express interfaces (PCI-E) 134, for example, for support of discrete graphics 136. Discrete graphics using a PCI-E interface has become an alternative approach to an accelerated graphics port (AGP). For example, the memory controller hub 126 may include a 16-lane (x16) PCI-E port for an external PCI-E-based graphics card (including, e.g., one of more GPUs). An example system may include AGP or PCI-E for support of graphics.

In examples in which it is used, the I/O hub controller 150 can include a variety of interfaces. The example of FIG. 1 includes a SATA interface 151, one or more PCI-E interfaces 152 (optionally one or more legacy PCI interfaces), one or more USB interfaces 153, a LAN interface 154 (more generally a network interface for communication over at least one network such as the Internet, a WAN, a LAN, a Bluetooth network using Bluetooth 5.0 communication, etc. under direction of the processor(s) 122), a general purpose I/O interface (GPIO) 155, a low-pin count (LPC) interface 170, a power management interface 161, a clock generator interface 162, an audio interface 163 (e.g., for speakers 194 to output audio), a total cost of operation (TCO) interface 164, a system management bus interface (e.g., a multi-master serial computer bus interface) 165, and a serial peripheral flash memory/controller interface (SPI Flash) 166, which, in the example of FIG. 1, includes BIOS 168 and boot code 190. With respect to network connections, the I/O hub controller 150 may include integrated gigabit Ethernet controller lines multiplexed with a PCI-E interface port. Other network features may operate independent of a PCI-E interface.

The interfaces of the I/O hub controller 150 may provide for communication with various devices, networks, etc. For example, where used, the SATA interface 151 provides for reading, writing or reading and writing information on one or more drives 180 such as HDDs, SDDs or a combination thereof, but in any case the drives 180 are understood to be, e.g., tangible computer readable storage mediums that are not transitory, propagating signals. The I/O hub controller 150 may also include an advanced host controller interface (AHCI) to support one or more drives 180. The PCI-E interface 152 allows for wireless connections 182 to devices, networks, etc. The USB interface 153 provides for input devices 184 such as keyboards (KB), mice and various other devices (e.g., cameras, phones, storage, media players, etc.).

In the example of FIG. 1, the LPC interface 170 provides for use of one or more ASICs 171, a trusted platform module (TPM) 172, a super I/O 173, a firmware hub 174, BIOS support 175 as well as various types of memory 176 such as ROM 177, Flash 178, and non-volatile RAM (NVRAM) 179. With respect to the TPM 172, this module may be in the form of a chip that can be used to authenticate software and hardware devices. For example, a TPM may be capable of performing platform authentication and may be used to verify that a system seeking access is the expected system.

The system 100, upon power on, may be configured to execute boot code 190 for the BIOS 168, as stored within the SPI Flash 166, and thereafter processes data under the control of one or more operating systems and application software (e.g., stored in system memory 140). An operating system may be stored in any of a variety of locations and accessed, for example, according to instructions of the BIOS 168.

Additionally, though not shown for simplicity, in some embodiments the system 100 may include a gyroscope that senses and/or measures the orientation of the system 100 and provides related input to the processor 122, as well as an accelerometer that senses acceleration and/or movement of the system 100 and provides related input to the processor 122. Still further, the system 100 may include an audio receiver/microphone that provides input from the microphone to the processor 122 based on audio that is detected, such as via a user providing audible input to the microphone. The system 100 may also include a camera that gathers one or more images and provides images and related input to the processor 122. The camera may be a thermal imaging camera, an infrared (IR) camera, a digital camera such as a webcam, a three-dimensional (3D) camera, and/or a camera otherwise integrated into the system 100 and controllable by the processor 122 to gather pictures/images and/or video.

Also, the system 100 may include a global positioning system (GPS) transceiver that is configured to communicate with at least one satellite to receive/identify geographic position information and provide the geographic position information to the processor 122. However, it is to be understood that another suitable position receiver other than a GPS receiver may be used in accordance with present principles to determine the location of the system 100.

It is to be understood that an example client device or other machine/computer may include fewer or more features than shown on the system 100 of FIG. 1. In any case, it is to be understood at least based on the foregoing that the system 100 is configured to undertake present principles.

Figure 2:
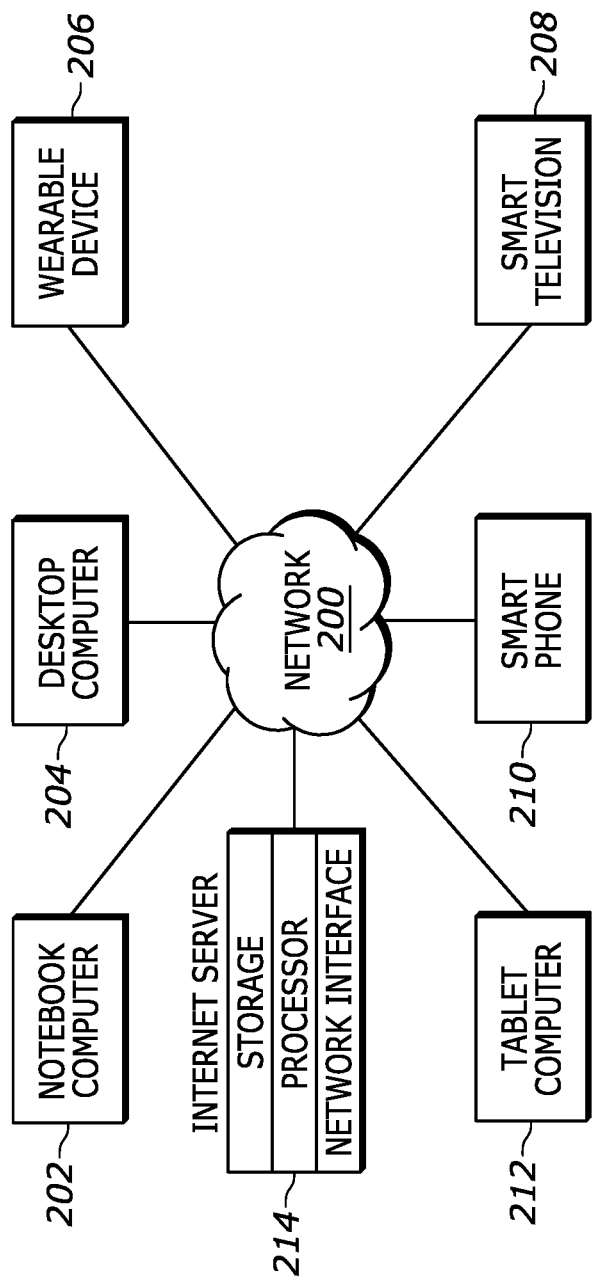
FIG. 2 is a block diagram of an example network of devices consistent with present principles.

Turning now to FIG. 2, example devices are shown communicating over a network 200 such as the Internet in accordance with present principles. It is to be understood that each of the devices described in reference to FIG. 2 may include at least some of the features, components, and/or elements of the system 100 described above. Indeed, any of the devices disclosed herein may include at least some of the features, components, and/or elements of the system 100 described above.

FIG. 2 shows a notebook computer and/or convertible computer 202, a desktop computer 204, a wearable device 206 such as a smart watch, a smart television (TV) 208, a smart phone 210, a tablet computer 212, and a server 214 such as an Internet server that may provide cloud storage accessible to the devices 202-212. It is to be understood that the devices 202-214 may be configured to communicate with each other over the network 200 to undertake present principles.

Figure 3:
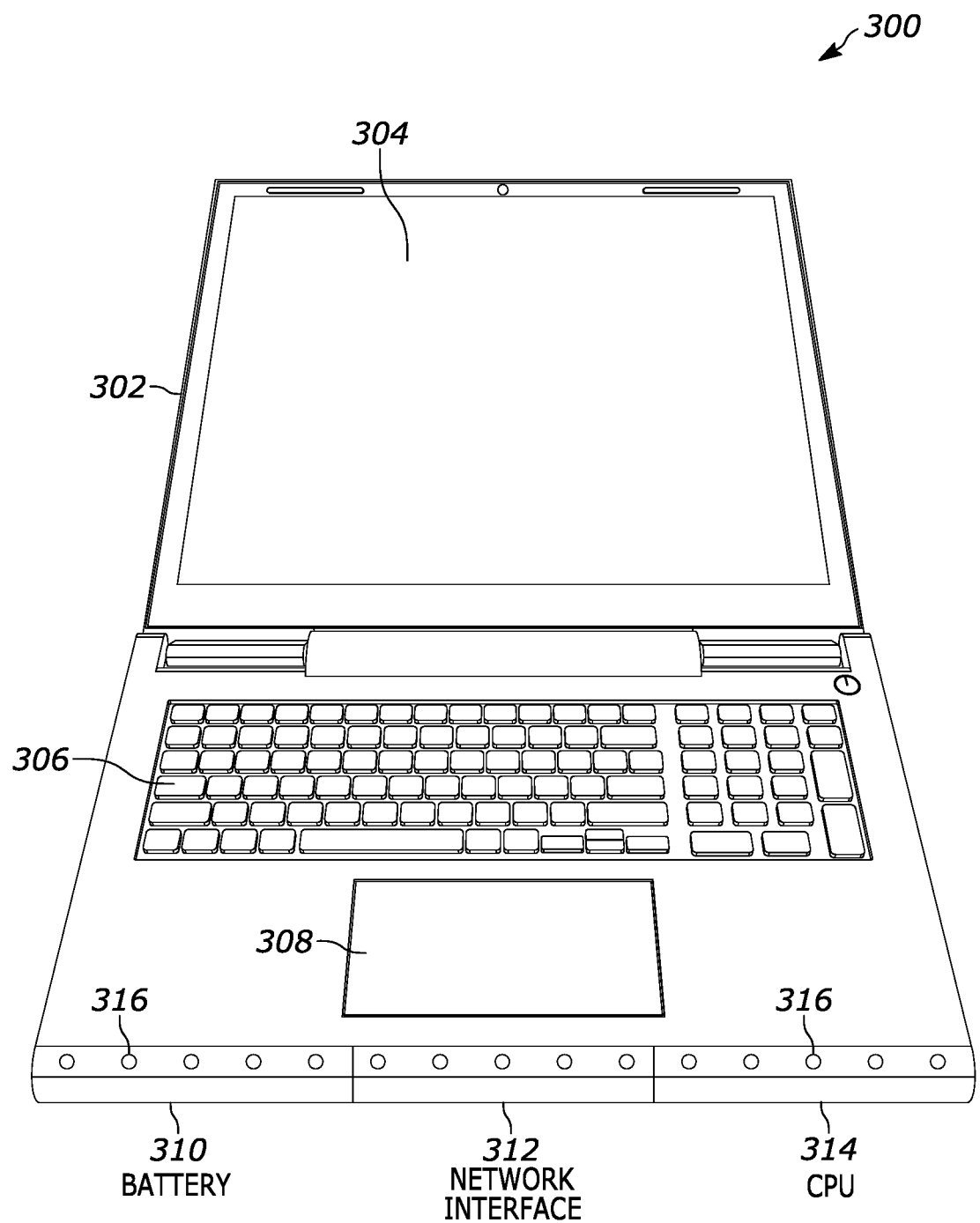
FIG. 3 is a perspective view a laptop computer with heat absorbing elements inside consistent with present principles.

Referring now to FIG. 3, it shows a perspective view a laptop computer 300 that has a housing 302 as well as a display 304, keyboard 306, and track pad 308. FIG. 3 also shows a lower part of the housing 302 in transparent form to show that, among other internal components, the housing 302 may house a battery 310 for powering the computer 300, a network interface 312 or other wireless transceiver for communicating with other devices and that may be similar to the LAN interface 154 in some examples, and a central processing unit (CPU) 314 or other processor (e.g., one of the processors 122 described above, a graphics processing unit (GPU), etc.). It is to be understood that during their respective use, each of those three items (and possibly other components) may produce heat that may otherwise affect performance of the computer 300 and possibly irreversibly degrade internal components to the point where they may malfunction or stop working altogether, including the components 310, 312, 314 themselves.

As also shown in FIG. 3, one or more spherical heat absorbers 316 consistent with present principles may be disposed within the housing 302 so that they physically touch and/or contact at least some portions of the respective components 310, 312, and 314. For instance, the absorbers 316 may abut the individual casings of the respective components 310, 312, and 314 as disposed within the housing 302. The spherical heat absorbers 316 may thus be arranged to absorb heat produced by the components 310-314 to thermally influence the components 310-314 by transferring heat from the components 310-314 to the absorbers 316.

Additionally, note that while the battery 310, network interface 312, and CPU 314 are described as producing heat within the housing 302 during operation of the computer 300, still other components within the housing 302 might also produce heat that may be absorbed by other heat absorbers as described herein, where those other heat absorbers may be juxtaposed adjacent to those other components.

In any case, once the components 310-314 stop being used or otherwise cool down, the absorbers 316 may begin to slowly and progressively release the heat they absorbed back into other parts of the computer 300. For instance, heat may be released back into the components 310-314 and still other components or the housing 302 itself, and ultimately into the external environment surrounding the computer 300.

Figure 4:
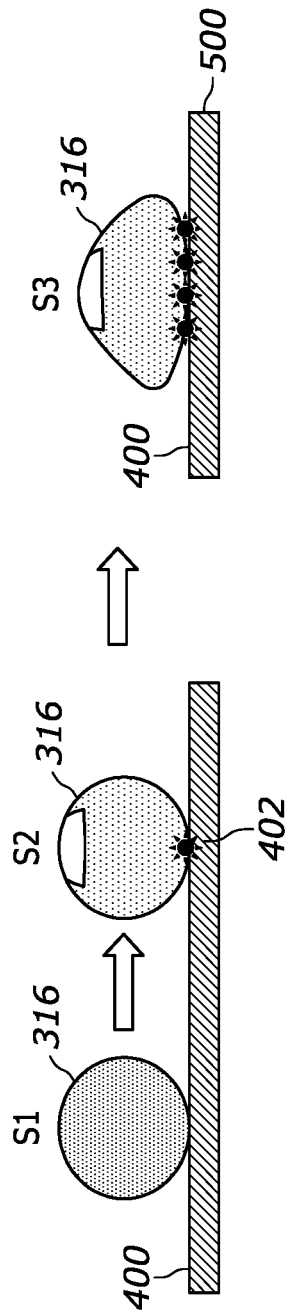
FIGS. 4-6 show illustrations of how an example heat absorbing element can deform from heat in order to create greater contact area with another component producing the heat consistent with present principles.
Figure 5:
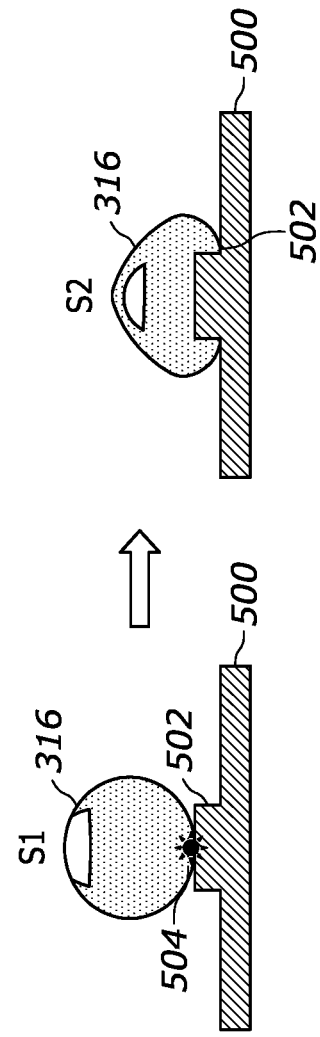
Figure 6:
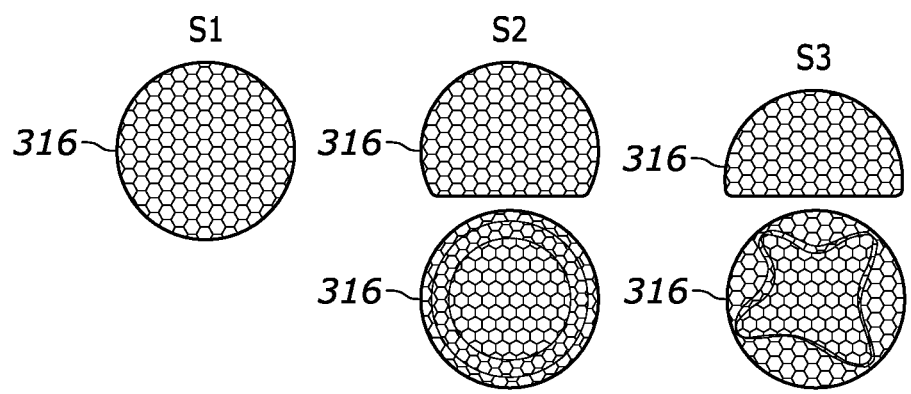

FIGS. 4-6 further illustrate. Beginning with FIG. 4, a single heat absorber 316 is shown. As also shown, the heat absorber 316 is disposed up against the casing 400 of an internal component such as a CPU or battery. At state S1 while the internal component itself is off or relatively cool, an external shell for the absorber 316 is in its default or remembered shape-memory state (a solid state) while inner material inside the shell is also in solid state. Then at state S2, heat produced by the internal component transfers to the absorber 316 through contact point 402 to begin to liquify the inner material as it absorbs heat from the internal component. Then at state S3 as the internal component continues to produce heat by increasing in temperature owing to its operation, the outer shell itself of the absorber 316 begins to melt and therefore deform, thereby increasing the contact area or number contact points between the absorber 316 and internal component as shown. Thus, it is to be understood that the external shell itself of the absorber 316 may have a higher melting point than the inner material.

Accordingly, in increasing the contact area, the ability of the absorber 316 to absorb heat is increased owing to the additional contact points/increased surface area of the absorber 316 against the casing 400. In other words, as the surface area for heat transfer increases, the absorber 316 may absorb more heat and faster.

FIG. 5 further illustrates where it shows a heat absorber 316 disposed atop a discrete protrusion 502 on a casing 500 of an internal component of a computer, such as a battery or network interface. At state S1, the heat absorber 316 is absorbing heat produced by the internal component at a contact point 504 having a first surface area.

Then as the internal component continues to increase in temperature, the heat absorber's outer shell with its higher melting point also begins to soften and deform as shown at state S2. In so doing, the amount of surface area of the absorber 316 that contacts the protrusion 502 and other parts of the casing 500 increases beyond the first surface area, increasing the heat absorbing ability of the absorber 316.

FIG. 6 also illustrates, it being understood that FIG. 6 also relates to an absorber 316 sitting atop or otherwise contacting a discrete protrusion like the protrusion 502. An elevational view of the absorber 316 is shown at state S1. At this state, an internal component proximate to the absorber 316 is either not producing heat or is not producing heat at a high enough temperature to melt the external shell of the absorber 316. Then as the internal component continues to increase in temperature as reflected in state S2, the external shell of the absorber 316 begins to melt and deform as shown in both the elevational view (top) and bottom plan view (bottom) for state S2. As the internal component further increases in temperature as reflected in state S3, the external shell of the absorber 316 deforms even further owing to increased melting to contact and surround one or more portions of the discrete protrusion as shown in both the elevational view (top) and bottom plan view (bottom) for state S3.

Accordingly, FIGS. 4-6 demonstrate the conforming composite shapes of the absorber 316 in that the absorber 316 may conform to the surface area of another component which it abuts or contacts.

Figure 7:
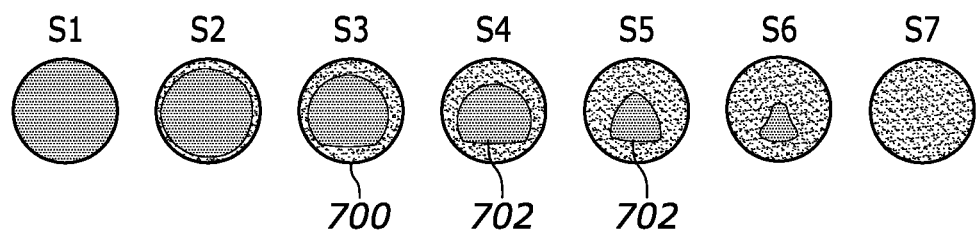
FIGS. 7 and 8 show various states of example inner material of a heat absorbing element to illustrate the phase-change process that the inner material may undergo as heat absorption increases consistent with present principles.

Now in reference to FIG. 7, it illustrates the solid to liquid phase-change process that the inner material 702 of an example heat absorber 700 may undergo as it absorbs heat from another component within a computer or other equipment such as manufacturing equipment, a power tool for building construction, etc. The inner material itself may include an insect wax or a paraffin wax, for example.

As shown in FIG. 7, states S1-S7 indicate progressively later times as the temperature of the other component increases, it being understood in reference to FIG. 7 that the outer shell of the absorber 700 is not illustrated as changing shape for simplicity and/or because a melting point for the outer shell is not reached in this example.

At state S1 of FIG. 7, none of the inner material 702 has melted yet. Then as shown in state S2, the peripheries of the inner material 702 closest to the external shell of the absorber 700 begin to melt from a solid into a liquid before other inner material 702 closer to the geometric center of the spherical absorber 700. Then more and more of the inner material 702 getting closer to the geometric center of the absorber 700 may melt as the temperature of the other component that thermally influences the absorber 700 increases, as reflected in states S3-S6. Note that in some examples the melting may not necessarily be even or uniform and that some parts of the inner material located at different radii from the geometric center of the spherical absorber 700 may melt before others or at the same time as shown. In any case, ultimately at state S7 all of the inner material 702 has changed phase from a solid to a liquid. The inner material 702 may then continue to absorb heat at least until it reaches its boiling point.

Figure 8:
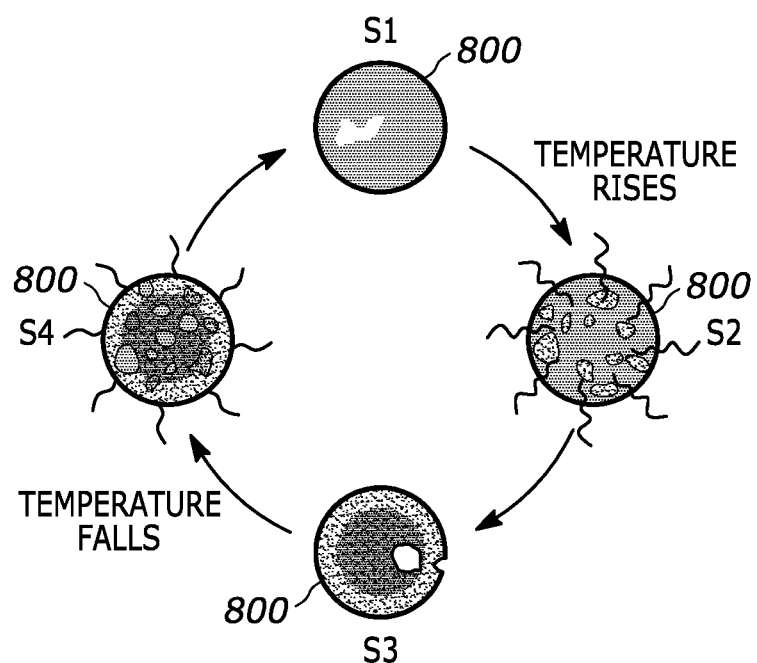

FIG. 8 illustrates phase-changes of the inner material of a heat absorber another way consistent with present principles, it being understood in reference to FIG. 8 that the outer shell is again not illustrated as changing shape for simplicity and/or because a melting point for the outer shell is not reached in this example. FIG. 8 illustrates the cycle that a heat absorber 800 may go through from cold to hot to cold again as it begins absorbing heat from another component and then releases the heat back into the environment as the other component cools. At state S1 the absorber 800 is in a state in which both its external shell and internal material are in solid state. Then the temperature of the absorber 800 begins to rise as it absorbs heat energy from another component as shown in state S2, and as such portions of the inner material inside the absorber 800 begin to melt. Later, at state S3, the temperature of the absorber 800 has increased even further as it continues to absorb additional heat energy, and thus the inner material is now entirely in liquid form and the outer shell of the absorber 800 may even begin to soften (and possibly melt).

Later as shown in state S4, as the temperature of the other component decreases, the outer shell of the absorber 800 may begin to harden or solidify, and ultimately return to its default or remembered form if it deformed owing to the memory-shape material of which the shell is composed. The memory-shape material itself may be configured for shape-memory using a thermochemical pretreatment process and/or two-way shape-memory programming, for example.

As cooling continues as also shown at state S4, portions of the inner material, which may have a lower melting point than the shell, may begin to change phases from liquid back to a solid. Thus, as the shell and inner material harden and/or change phases back into solids, heat energy may be released back into the environment external to the absorber 800 until ultimately the absorber 800 returns to state S1 in which the shell and inner material are both in their solid state.

Before moving on to the description of other figures, it is to be understood consistent with present principles that the inner material of a heat absorber as disclosed herein may be established by one and possibly two different phase-change materials, while the external shell may be established by yet another, different phase-change material. Furthermore, the material of the external shell may not only constitute a phase-change material but also a shape-memory material such as a shape-memory polymer (e.g., polycaprolactone).

Other examples of phase-change materials that may establish parts of the inner material and/or outer shell in various combinations, depending on the application to which present principles might be applied, include $MgCl_2.6H_2O$, $Mg(NO_3)_2.6H_2O$, $Ba(OH)_2.8H_2O$, $CaCl_2.6H_2O$, paraffin waxes, other paraffins and other organic phase-change materials besides paraffins including fatty acids and esters and glycols and alcohols, polyglycol E600, palmitic acid, capric acid, caprylic acid, naphthalene, other inorganic phase-change materials including other salt hydrates and metal alloys and other metallics (e.g., with low melting points), eutectics including eutectics of the foregoing in various organic-only, inorganic-only, and organic-inorganic combinations, etc.

Figure 9:
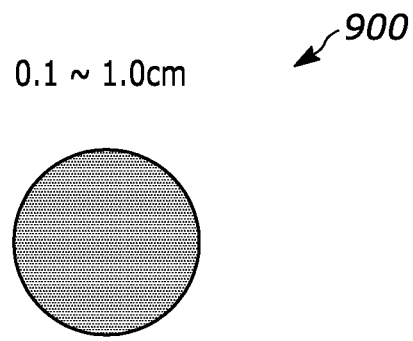
FIG. 9 shows an example foam or sponge or fabric that can be included in the inner material of an example heat absorbing element consistent with present principles.

What's more, in some examples one of the phase-change materials that in part establishes the inner material may itself be a shape-memory material such as a shape-memory polymer. Thus, in certain examples the shape-memory material of the inner material may remember the form of a foam or sponge or fabric 900 as illustrated in FIG. 9. The foam or sponge or fabric 900 may thus have internal pockets of empty space to absorb or store portions of other phase-change material that also makes up part of the inner material that is disposed inside the external shell of an absorber itself. The other phase-change material of the inner material that gets absorbed or stored by the foam 900 may be a paraffin wax, for example.

As also shown in FIG. 9, in some example implementations the foam or sponge or fabric 900 may be generally spherical but have a lesser radius/diameter than the spherical external shell in which it is or will be disposed. Thus, in certain example implementations the diameter of the foam or sponge or fabric 900 may be anywhere from one tenth of a centimeter to one centimeter, with the diameter of the external shell being greater than that.

Even further, it is to be understood that the melting points of all three of the different phase-change materials may be different in embodiments where three phase-change materials are used. This is reflected in FIG. 10, which shows an example table 1000 illustrating present principles according to example materials. As shown, the table 1000 may have different rows for different phase-change materials (PCMs) and different columns for different temperatures expressed in Celsius. The table 1000 indicates that a first phase-change material (PCM I), which may be a phase-change material establishing part of the inner material of a heat absorber but that might not have shape memory itself and/or be a shape-memory material, may begin to soften around forty five degrees Celsius and begin melting at sixty five degrees Celsius. The first phase-change material may be a paraffin wax, for example.

The table 1000 also indicates that a second phase-change material (PCM II), which may establish the outer shell of the heat absorber and have shape memory and/or be made of shape-memory material, may begin to soften around sixty five degrees Celsius and begin melting at eighty five degrees Celsius. The second phase-change material may be a carbon crosslinked polymer such as polycaprolactone or another suitable polymer, for example.

Still further, the table 1000 indicates that a third phase-change material (PCM III), which may be a phase-change material establishing another part of the inner material of a heat absorber but may also have shape memory and/or be made of a shape-memory material, may begin to soften around seventy five degrees Celsius and begin melting at ninety five degrees Celsius. The third phase-change material may also be a carbon crosslinked polymer that may establish the foam or sponge or fabric referenced above for example.

Also in certain examples, the third phase-change material may have a higher melting point than both of the first and second phase change materials so that it melts at higher temperatures than the other two materials and returns to its default, cool temperature remembered shape at a higher temperature than the other two materials. The third phase-change material may therefore assist the outer shell of the heat absorber with assuming its own similar remembered shape as the outer shell also cools.

However, notwithstanding the foregoing, in other examples the third phase-change material may have a higher melting point than the first phase change material (also part of the inner material) but lower than the second phase change material (for the outer shell). But even in these examples the third phase-change material can still assist the outer shell with assuming its remembered shape as both might be of similar shapes (e.g., both with remembered spherical shapes).

Figure 10:
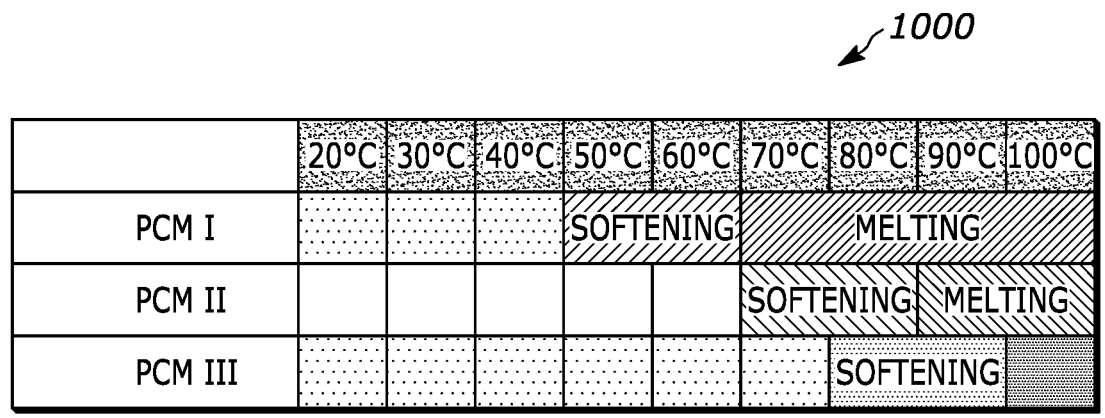
FIGS. 10-12 show example tables illustrating the melting points of various materials that may be used as part of a heat absorbing element consistent with present principles.
Figure 11:
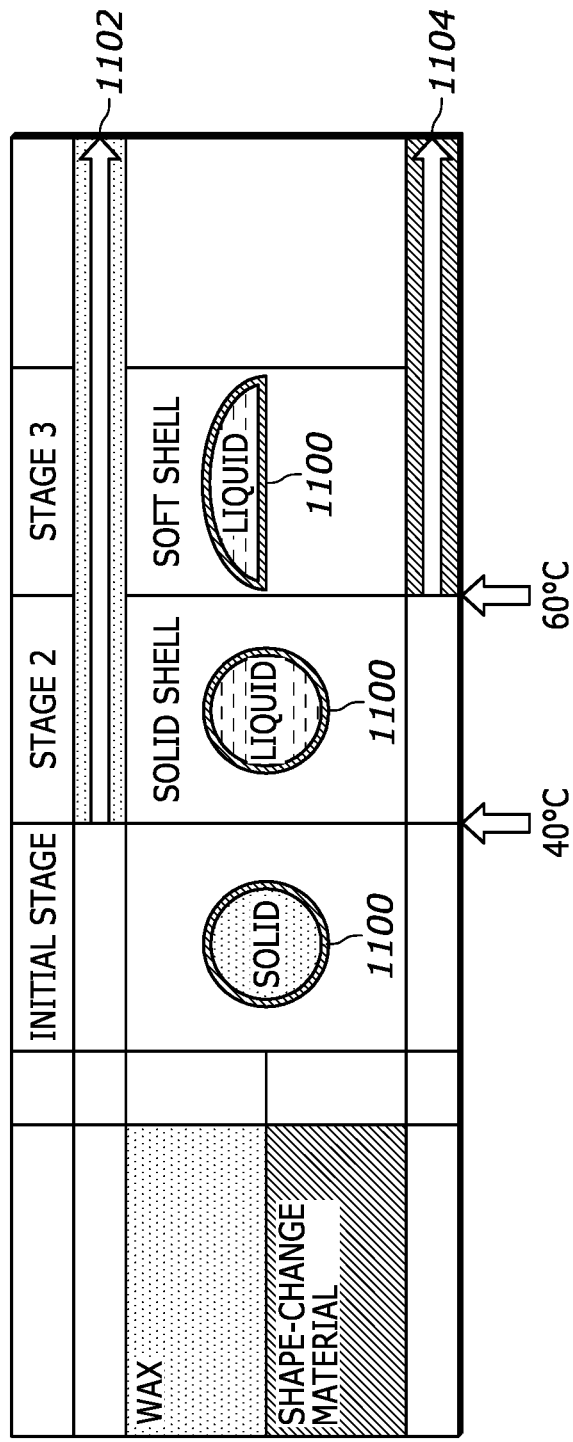
Figure 12:
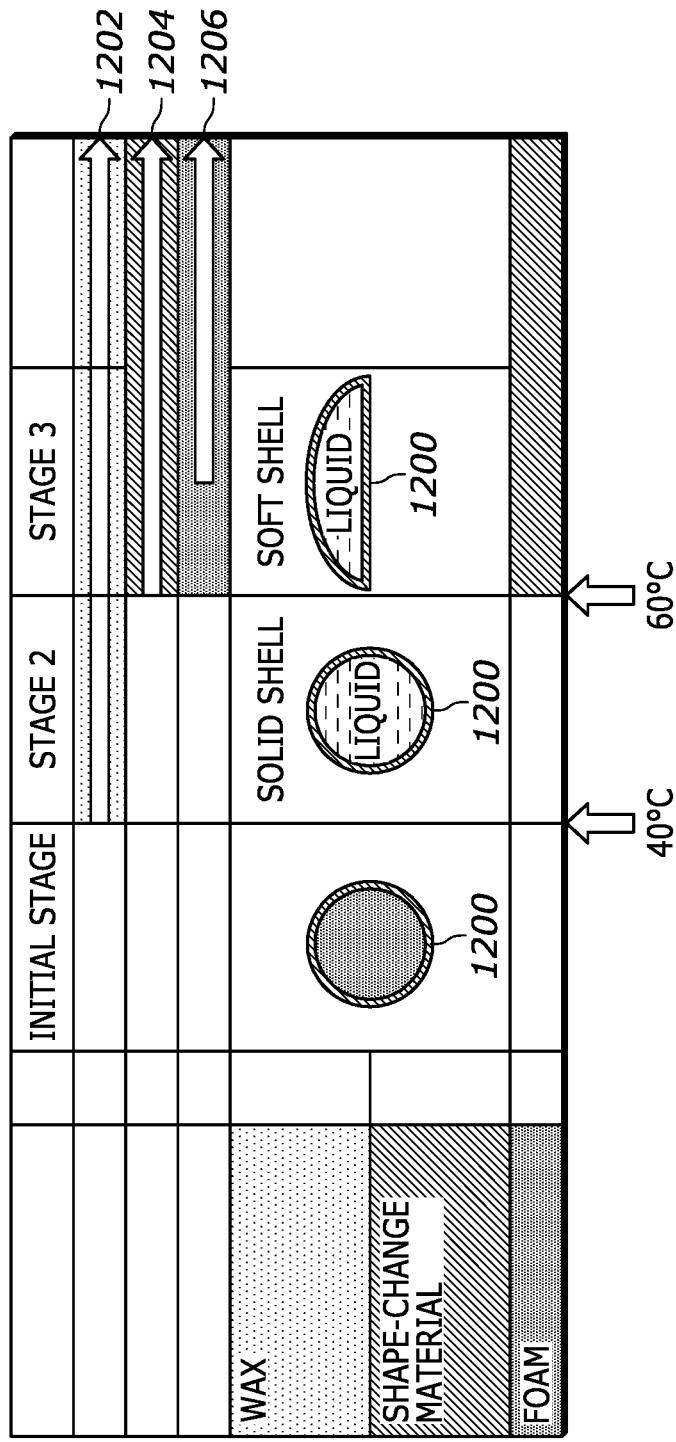

Further note in reference to FIG. 10 that in some example implementations, only the first and second phase change materials may make up a heat absorber so that no foam or sponge third material forms part of the absorber's inner material. Thus, the first phase change material may establish most or all of the inner material, and the second phase change material may establish the outer shell. FIGS. 11 and 12 further illustrate the differing example implementations.

Beginning first with FIG. 11, it illustrates a two phase-change material implementation where a first phase-change material that may be wax establishes the inner material of a heat absorbing element 1100 consistent with present principles. A second phase-change material that may be a shape-memory polymer establishes the outer shell of the heat absorbing element 1100. As also shown in FIG. 11, at an initial stage the element 1100 is at a temperature equilibrium with its surrounding environment (including other adjacent components of a computer, for example). At this stage, both the inner material and outer shell are in their solid states.

Stage 2 may then be entered once the thermal influence on the element 1100 reaches forty degrees Celsius and above, and hence the element 1100 itself begins to heat to forty degrees Celsius and above. Also at forty degrees Celsius, the inner material may begin to liquify and may stay liquified at even higher temperatures as indicated by arrow 1102.

Stage 3 may then be entered once the thermal influence on the element 1100 reaches sixty degrees Celsius and above, and hence the element 1100 itself begins to heat to sixty degrees Celsius and above. At sixty degrees Celsius, the inner material is still liquified but now the outer material also begins to soften and deform and possibly melt into a liquid as temperature increases, as indicated by arrow 1104.

Now in reference to FIG. 12, it illustrates a three phase-change material implementation where both a first phase-change material (e.g., wax) and a third, different phase-change material both establish the inner material of a heat absorbing element 1200 consistent with present principles. Also in this implementation, a second phase-change material that may be a shape-memory polymer may establish the outer shell of the heat absorbing element 1200. Note once again that in some examples the third phase-change material may also be made of a shape-memory material to establish a foam or sponge or fabric and may have a higher melting point than the first and second materials.

Accordingly, as shown in FIG. 12 at an initial stage the element 1200 is at a temperature equilibrium with its surrounding environment. At this stage, both the inner material and outer shell are in their solid states. Stage 2 may then be entered once the thermal influence on the element 1200 reaches forty degrees Celsius and above, and hence the element 1200 itself begins to heat to forty degrees Celsius and above. Also at forty degrees Celsius, the first phase-change material of the inner material may begin to liquify and may stay liquified at even higher temperatures as indicated by arrow 1202.

Stage 3 may then be entered once the thermal influence on the element 1200 reaches sixty degrees Celsius and above, and hence the element 1200 itself begins to heat to sixty degrees Celsius and above. At sixty degrees Celsius, the first phase-change material is still liquified but now the outer material (the second phase-change material) also begins to melt and may continue to melt (and potentially liquify) at even higher temperatures as indicated by arrow 1204. But also at Stage 3, once the temperature of the thermal influence increases to seventy five degrees Celsius, for example, the third phase-change material with shape-memory programming may also begin to soften, as indicated by arrow 1206, and ultimately melt at ninety five degrees for instance.

Figure 13:
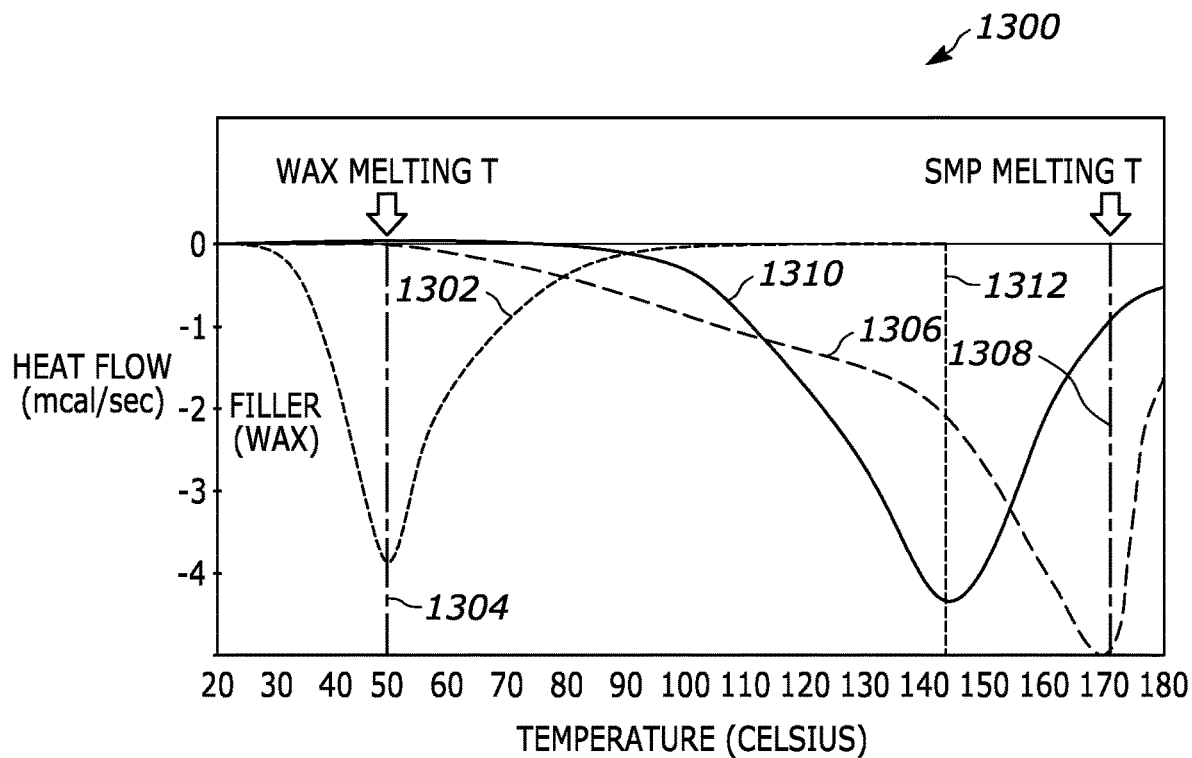
FIG. 13 is a graph also illustrating the melting points of various example materials that may be used as part of a heat absorbing element consistent with present principles.

Now describing FIG. 13, it shows an example graph 1300 consistent with present principles, where the graph 1300 shows various curves in a differential scanning calorimetry context with the Y-axis representing heat flow and the X-axis representing temperature to show that endothermic properties (e.g., for melting) are reversible for phase-change materials. As shown, a first curve 1302 represents an example first phase-change material such as paraffin wax that may be included in the inner material of a heat absorber consistent with present principles. As shown by the line 1304 going through the apex of the curve 1302, this example material has a melting point of approximately fifty degrees Celsius, the lowest melting point of the three materials shown by the curves of the graph 1300.

As also shown in FIG. 13, a second curve 1306 represents an example second phase-change material that may be used as the outer shell of a heat absorber consistent with present principles. Note that this example second material may also be a shape-memory polymer. As shown by the line 1308 going through the apex of the curve 1306, this example material has a melting point of approximately one hundred seventy degrees Celsius, the highest melting point of the three materials shown by the curves of the graph 1300.

Still further, the graph 1300 shows a third curve 1310 that represents an example third phase-change material that may be used as part of the inner material of a heat absorber consistent with present principles. Note that this example third material may also be a shape-memory polymer that may establish the foam or fabric or sponge-type structure referenced above. As shown by the line 1312 going through the apex of the curve 1310, this example material has a melting point of approximately one hundred forty five degrees Celsius, which is a melting point higher than that of the first material but lower than that of the second material.

Figure 14:
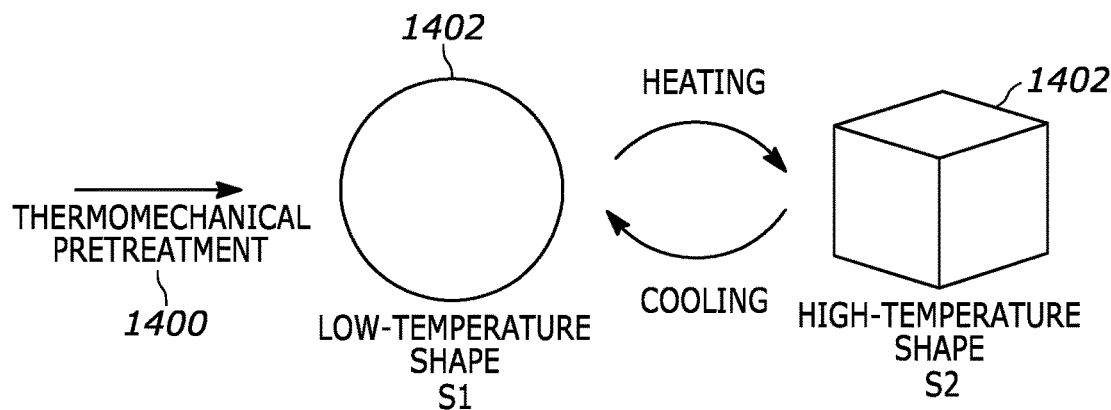
FIG. 14 shows an example heat absorbing element consistent with present principles that may have two remembered shapes.

Reference is now made to FIG. 14, which shows an alternate embodiment of a heat absorber element consistent with present principles. According to this embodiment, a shape-memory polymer or other suitable material may be configured through thermomechanical pretreatment 1400 to have two remembered shapes. Thus, a heat absorber 1402 may have a generally spherical remembered shape at state S1 while at a relatively low temperature and then, upon phase transition during heating, transition to a generally cubical remembered shape at state S2. Then once the absorber 1402 begins cooling again and reaches its phase transition temperature, it may return to its remembered spherical shape.

Moving on from FIG. 14, it is to be generally understood consistent with present principles that heat absorbing elements as disclosed herein may not necessarily be spherical or spheroidal in remembered shape in solid phase form, and that they may also be, for example, helical or conical. In any of those situations, however, also note that the heat absorbing elements themselves may be micro-sized or nano-sized in some example implementations. For example, if the elements are nano-sized spherical elements, the diameter may be between one and one hundred nanometers.

It is to also be generally understood that the shape-memory materials disclosed herein may be configured to remember a particular shape using any suitable process, such as four-dimensional (4D) printing and/or stereolithography for example. It is to also be understood that the inner material of a heat absorbing element consistent with present principles may be encapsulated in the outer shell using any suitable process, including those employed in the pharmaceutical context.

It may now be appreciated that present principles provide for an improved heat absorber that improves the functionality and usable life of other devices and components that may thermally influence the absorber.

It is to be understood that whilst present principals have been described with reference to some example embodiments, these are not intended to be limiting, and that various alternative arrangements may be used to implement the subject matter claimed herein. Components included in one embodiment can be used in other embodiments in any appropriate combination. For example, any of the various components described herein and/or depicted in the Figures may be combined, interchanged or excluded from other embodiments.

What is claimed is:

1. A device, comprising:
   a housing;
   at least one processor within the housing;
   storage accessible to the at least one processor and within the housing; and
   plural spherical heat absorbers within the housing, each spherical heat absorber comprising an outer shell and inner material, the outer shell comprising a first shape-memory material, the inner material comprising first phase-change material different from the first shape-memory material;
   wherein the first shape-memory material changes shape under thermal influence;
   wherein each spherical heat absorber comprises a second shape-memory material that absorbs the first phase-change material, the second shape-memory material comprising one of: a sponge, a foam, a fabric; and
   wherein the outer shell is spherical, and wherein the second shape-memory material in remembered shape has a smaller radius than the radius of the outer shell.

2. The device of claim 1, wherein the first shape-memory material comprises a carbon crosslinked polymer.

3. The device of claim 2, wherein the carbon crosslinked polymer comprises polycaprolactone.

4. The device of claim 1, wherein the device comprises at least one battery within the housing, and wherein at least some of the spherical heat absorbers are arranged within the device to absorb heat from the battery.

5. The device of claim 1, wherein the device comprises at least one wireless transceiver within the housing, and wherein at least some of the spherical heat absorbers are arranged within the device to absorb heat from the wireless transceiver.

6. The device of claim 1, wherein the first shape-memory material is configured to change shape under thermal influence so that the shape of the outer shell changes shape under thermal influence.

7. The device of claim 6, wherein the outer shell changes shape under thermal influence to increase a contact area between the outer shell and another component of the device.

8. The device of claim 6, wherein the first shape-memory material is programmed for two-way shape-memory.

9. The device of claim 1, wherein the second shape-memory material comprises a sponge that absorbs the inner material.

10. The device of claim 1, wherein the second shape-memory material comprises internal pockets of space into which the first phase-change material is absorbed.

11. The device of claim 1, wherein the second shape-memory material is spherical in remembered shape.

12. A method, comprising:
    providing a device comprising a housing; and
    providing plural heat absorbers within the housing, the heat absorbers juxtaposed with one or more other components of the device to absorb heat from the one or more other components, each heat absorber comprising an outer shell and inner material, the outer shell comprising a first shape-memory material that changes shape under thermal influence, the inner material comprising first phase-change material different from the first shape-memory material;
    wherein each heat absorber comprises a second shape-memory material that absorbs the first phase-change material, the second shape-memory material comprising one of: a sponge, a foam, a fabric; and
    wherein the outer shell is spherical, and wherein the second shape-memory material in remembered shape has a smaller radius than the radius of the outer shell.

13. The method of claim 12, comprising:
    configuring the first shape-memory material for shape-memory using four-dimensional (4D) printing.

14. The method of claim 12, comprising: configuring the first shape-memory material using stereolithography.

15. The method of claim 12, comprising:
    configuring the first shape-memory material using two-way shape-memory programming.

16. The method of claim 12, comprising:
    configuring the first shape-memory material using a thermochemical pretreatment process.

17. A heat absorber element, comprising:
    an outer shell comprising a first shape-memory material that changes shape under thermal influence; and
    inner material housed within the outer shell, the inner material comprising first phase-change material different from the first shape-memory material, the melting point of the first phase-change material being lower than the melting point of the first shape-memory material, the inner material further comprising a second shape-memory material that absorbs the first phase-change material, the second shape-memory material comprising one of: a sponge, a foam, a fabric;
    wherein the outer shell is spherical, and wherein the second shape-memory material in remembered shape has a smaller radius than the radius of the outer shell.

18. The heat absorber element of claim 17, wherein the first shape-memory material comprises a carbon crosslinked polymer.

19. The heat absorber element of claim 17, wherein the second shape-memory material comprises a second phase-change material different from the first phase-change material and different from the first shape-memory material, the second phase-change material having a melting point higher than the first phase-change material and the first shape-memory material.

20. The heat absorber element of claim 17, wherein the second shape-memory material comprises internal pockets of space into which the first phase-change material is absorbed.

* * * * *